United States Patent [19]

Rogner

[11] Patent Number: 4,642,416
[45] Date of Patent: Feb. 10, 1987

[54] HIGH-FREQUENCY SEAL FOR CASING COVERINGS AND DOORS

[75] Inventor: Ludwig Rogner, Regensburg, Fed. Rep. of Germany

[73] Assignee: Siemens Aktiengesellschaft, Berlin and Munich, Fed. Rep. of Germany

[21] Appl. No.: 703,357

[22] Filed: Feb. 20, 1985

[30] Foreign Application Priority Data

Mar. 1, 1984 [DE] Fed. Rep. of Germany ....... 3407657

[51] Int. Cl.[4] .............................................. H05K 9/00
[52] U.S. Cl. ................................................ 174/35 GC
[58] Field of Search ....................... 174/35 R, 35 GC; 361/424; 219/10.55 D

[56] References Cited

U.S. PATENT DOCUMENTS 3,240,862  3/1966  Merkl et al. .
3,413,406  11/1968 Plummer .
3,889,043  6/1975  Ducros .

OTHER PUBLICATIONS

Primec Corporation, "Electroknit Mesh", 9/69.
Scanbe Manufacturing Corp., "Spira", 9/69.
"Gaskets That Block EMI", Severinsen, Machine Design, vol. 47, No. 19, 8/75.
Article, "An EMI Shield is Only as Effective as Its Weakest Link-The Gasket", 2328 Electronic Design, vol. 27, No. 9 (1979.04.26), 5 pages.

Primary Examiner—Arthur T. Grimley
Assistant Examiner—D. A. Tone
Attorney, Agent, or Firm—John Francis Moran

[57] ABSTRACT

High-frequency seal for casing coverings, for instance, electromagnetic interference suppressors, and for doors of chambers that are to be shielded from high frequencies, with an interference-suppressing sealing cord which contains at least two partially rolled up metallic meshes (10 and 15) in the form of strips, which are in contact with the surfaces to be sealed, the unrolled parts of which (12 and 18) lie one above the other and the rolled up parts of which (11 and 17) lie next to one another.

2 Claims, 8 Drawing Figures

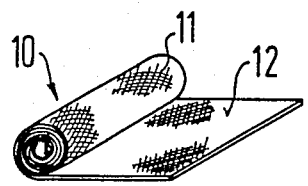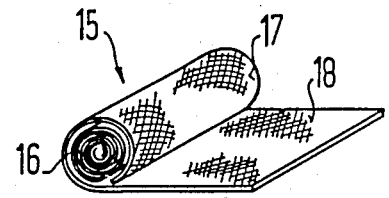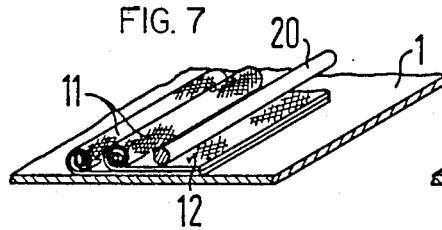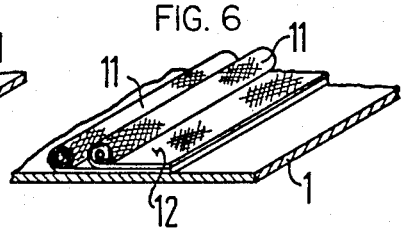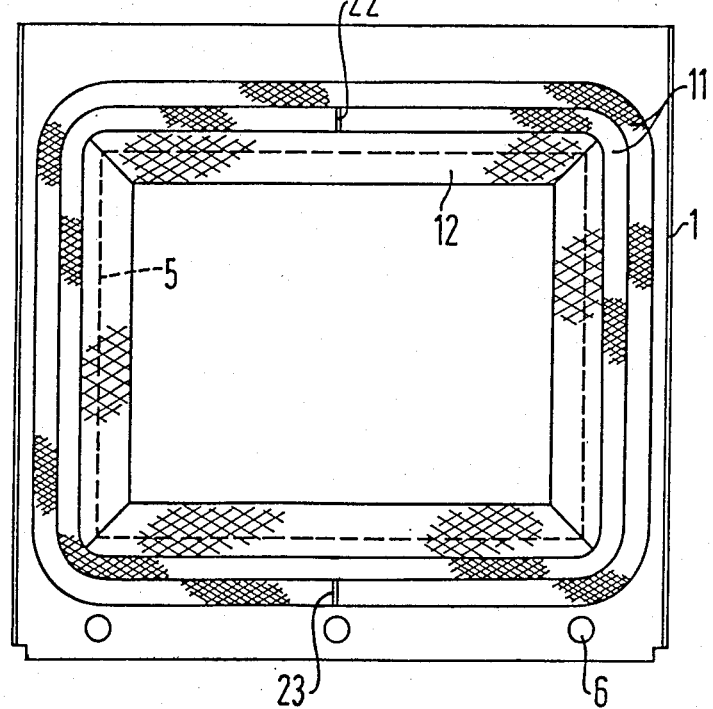

HIGH-FREQUENCY SEAL FOR CASING COVERINGS AND DOORS

BACKGROUND OF THE INVENTION

This invention relates to seals for a radio frequency interference shielded enclosure, and, more particularly, it relates to electrical interference suppressors for the doors of enclosures that are to be shielded from high frequencies. Such seals utilize an interference-suppressor sealing cord, which contains partially rolled up metallic mesh in the form of strips, which comes in contact with the surfaces to be sealed.

Conventional high-frequency seals of this type, also known as EMI (Electromagnetic Interference) gaskets are available commercially from Shielding Technologies, Inc. and/or Chomerics, Inc. under the name of Metalex cords. Their strip-shaped metallic mesh, made, for example, of aluminum, is partially wound on a hollow roll, whose hollow center is filled with plastic or elastic insulating material or with a roll wound in the shape of a spiral, which will preferably be made of the same metallic mesh.

German Patent Document DE-AS 23 28 951 describes a high-frequency seal for casings which has a flexible, electrically conductive band, in which plastically flexible magnetic or magnetizable material, in particular permanent magnets, is enclosed, with the band being surrounded by a metallic mesh.

Described in German Patent Document DE-GM 17 86 047, is a high-frequency seal in which, between a cover of a casing and the edge opposite to it, a transverse elastic intermediate layer is provided as a shield cover for sealing the housing against radiation after the cover is put on. In this case, high-frequency devices are placed in the casing, which are not supposed to generate interference radiation in the vicinity of the casing. The cover must be pressed down onto the housing and fastened there by means of typical design devices, in order to ensure that there is metallic pressure from both sides against the transverse elastic intermediate layer and a resulting good electrical connection between the cover and the casing.

German Patent Document DE-PS 25 22 186 concerns a high-frequency seal which operates between a casing and a door, with a sealing element which has a bracket-like projection, which is clamped into a groove in the casing or the door by means of an elastic rib. The sealing element has a round elastic core, which is surrounded by a conducting sheath. The core and the sheath of the sealing element are arranged between the elastic rib and the part of the casing that is opposite to it, so that the pressure is absorbed partly by the sealing element and partly by the elastic rib.

Finally, as shown in FIGS. 1 to 3, a prior art high-frequency seal for casing covers for the metallic casings of electrical interference suppressor filters, which consists of high-frequency sealing cord arranged alternately with strips of sponge rubber strips, the latter being fixed with adhesive to the inside of the casing cover. The disadvantage inherent in this conventional high-frequency seal are described more fully in the following detailed description with appropriate figures.

SUMMARY OF THE INVENTION

An object of the present invention is to provide a high-frequency seal of the type described above which occupies a minimum of space and can be easily mounted in a secure fashion on the surfaces to be sealed.

In order to accomplish this purpose, the invention takes the form of a high-frequency seal including an interference-suppressor sealing cord containing at least two partially rolled up metallic meshes in the form of strips, the unrolled parts of which lie one above the other and the rolled up parts of which preferably lie next to one another in alternation.

This design and arrangement of the high-frequency seal provides an essentially perfect shield. It is preferable in this case to have the unrolled, somewhat rib-like projections spot-welded, or—if necessary—welded by means of a so-called sealing wire, to one of the surfaces to be sealed. The wire, which is placed in accordance with the desired arrangement or direction of the interference-suppressor cord, ensures that the interference-suppressor sealing cord will be fastened securely, even if it must follow a complicated path.

BRIEF DESCRIPTION OF THE DRAWING

Additional features and advantages of the invention will become apparent by reading the detailed description in conjunction with the drawing wherein:

FIG. 4 is a perspective diagrammatic presentation of an element suitable for use in an interference-suppressor sealing cord in accordance with the invention.

FIG. 5 shows, from the same point of view as in FIG. 4, another element suited for use in an interference-suppressor sealing cord pursuant to the invention.

FIG. 6 shows an interference-suppressor sealing cord pursuant to the invention, composed of the elements shown in FIGS. 4 and 5 and placed on a casing cover, in a perspective and partially broken off presentation.

FIG. 7 shows, from the same point of view as in FIG. 6, a second method for the fastening of an interference-suppressor sealing cord pursuant to the invention to a casing cover.

FIG. 8 shows, from the same point of view as in FIG. 1, a bottom view of a high-frequency seal pursuant to the invention for a casing cover.

DETAILED DESCRIPTION

Figure 1:
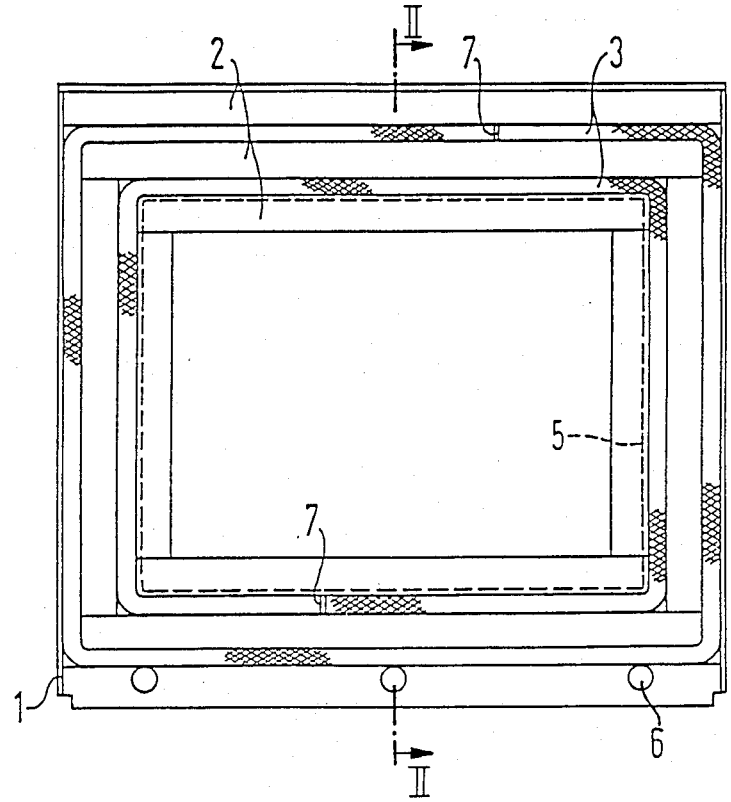
FIG. 1 illustrates a bottom view of a casing cover which might be used for an electrical filter casing with a conventional high-frequency seal, and with the opening of the casing being indicated by a broken line.
Figure 2:
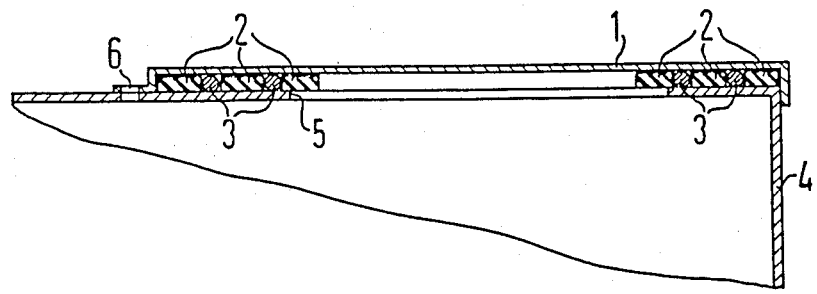
FIG. 2 depicts a section on the line II—II in FIG. 1, with the casing cut away and broken off.
Figure 3:
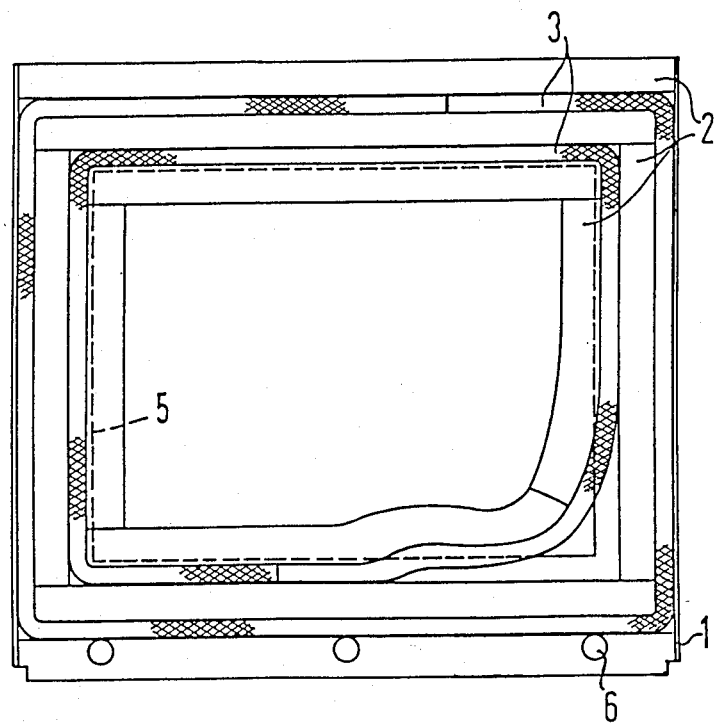
FIG. 3 shows the high-frequency seal shown in FIG. 1 from the same perspective as in FIG. 1, but with strips of sponge rubber and sealing cords loosened from their fastenings.

In the conventional arrangement shown in FIGS. 1 to 3, on the bottom or inner surface of a casing cover 1, which might be used for a filter housing 4, there are fastened with adhesive strips of sponge rubber 2, arranged at a distance from one another, and sealing cords 3, with the sealing cords 3 being clamped between the sponge rubber strips. For reasons to do with high-frequency technology, the ends 7 of the sealing cords meet on opposite sides of the dotted-line opening 5 of a filter casing 4, which is shown, broken off, in FIG. 2.

In order for the casing cover 1 to be fastened with screws to the filter casing, it is provided with holes 6 along one of its edges. The sealing cords 3 might be made of elastic cords consisting of insulating material, which are surrounded with a hose-like metallic mesh.

Extraordinary accuracy must be used in assembly this high-frequency seal. Thus, when the sponge rubber strips 2 are fastened to the housing cover 1, the adhesive must not get under the sealing cords 3, for in this case the electrical connection between the casing cover 1 and the sealing cord 3 is interrupted. If the filter casing is subjected to mechanical stress, or in the event of manufacturing defects, the sealing cord can "spring" out of its position (see FIG. 3), in which case the high-frequency seal will lose its sealing properties. In addition, the sealing cords 3, which are only clamped in between the sponge rubber strips 2, may fall out when the casing cover 1 is lifted off.

In contrast with the sealing cords 3 used in the high-frequency seal shown in FIGS. 1 to 3, the interference-suppressor sealing cord pursuant to the invention, which is shown in FIGS. 6 to 8, contains the elements 10 and/or 15 (see FIG. 4 and FIG. 5 respectively), made of partially rolled up metallic mesh in the form of strips. At least two of these elements 10 and/or 15 are, in this case, combined to form each of the interference-suppressing sealing cords—as shown in FIGS. 6 and 7. Here the unrolled parts 12 and 18 of the elements 10 and 15 respectively lie above one another, and the rolled up parts 11 and 16, 17 respectively lie next to one another.

The element 10 shown in FIG. 4 comprises a metallic mesh that has been partially wound into a spiral. In the case of element 15, shown in FIG. 5, this metallic mesh has been partially wound onto a hollow roll, the inside of which is filled with a second metallic mesh 16 that has been wound into a spiral, or a core of insulating material that is elastic, and if necessary also plastic.

As shown in FIG. 6, the unrolled parts 12 of the interference-suppressor sealing cord can be spot-welded to the casing cover 1. If there are any problems with regard to the fastening of the interference-suppressor sealing cord, then, in addition, a wire 20 (see FIG. 7) can be placed on the unrolled part 12 of the interference-suppressor sealing cord, which follows the desired path of the interference-suppressor sealing cord and is welded to the surface of the casing cover 1 that lies beneath it.

It should be noted that in each case the metallic mesh, whether of element 10 of element 15, that lies on top or is outermost is smaller in width, and that the ends, such as ends 22 and ends 23, of the individual elements meet on opposite sides of the opening 5 of the casing as shown in FIG. 8.

Although specific embodiments of the invention have been described, it is to be understood that numerous and varied other changes and modifications of the inventive sealing gasket arrangement will occur to those skilled in the art. Accordingly, it is contemplated that such modifications are within the spirit and scope of the invention which is only limited in scope by the appended claims.

What is claimed is:

1. A radio-frequency seal of the type for enclosure coverings for electromagnetic interference suppression including doors for enclosures shielded from radio-frequencies, with an interference-suppressing sealing cord, the doors and the enclosures having surfaces, the seal including partially rolled up metallic mesh in the form of strips, which comes in contact with the surfaces to be sealed, the radio frequency seal comprising an interference-suppressor sealing cord having at least two partially rolled up metallic meshes in the form of strips, the unrolled portion of the metallic meshes lying one above the other while the rolled up portions of the metallic meshes lying next to one another, the interference-suppressing sealing cord is spot-welded on its unrolled portions to one of the surfaces to be sealed, and the metallic mesh lying above the other metallic mesh having the smaller width of the two metallic meshes.

2. A radio-frequency seal of the type for enclosure coverings for electromagnetic interference suppression including doors for enclosures shielded from radio-frequencies, with an interference-suppressing sealing cord, the doors and the enclosures having surfaces, the seal including partially rolled up metallic mesh in the form of strips, which comes in contact with the surfaces to be sealed, the radio frequency seal comprising an interference-suppressor sealing cord having at least two partially rolled up metallic meshes in the form of strips, the unrolled portion of the metallic meshes lying one above the other while the rolled up portions of the metallic meshes lying next to one another, and a wire being placed on the unrolled portions of the interference-suppressing sealing cord which lie above one another, the wire following a predetermined path for the interference-suppressing sealing cord and being welded to the surface to be sealed, which lies beneath it.

* * * * *